US005687112A

United States Patent [19]
Ovshinsky

[11] Patent Number: 5,687,112
[45] Date of Patent: Nov. 11, 1997

[54] MULTIBIT SINGLE CELL MEMORY ELEMENT HAVING TAPERED CONTACT

[75] Inventor: Stanford R. Ovshinsky, Bloomfield Hills, Mich.

[73] Assignee: Energy Conversion Devices, Inc., Troy, Mich.

[21] Appl. No.: 635,442

[22] Filed: Apr. 19, 1996

[51] Int. Cl.⁶ .................................. G11C 11/00
[52] U.S. Cl. ...................... 365/163; 257/3; 257/4
[58] Field of Search ................ 365/163; 257/2, 257/3, 4, 5

[56] References Cited

U.S. PATENT DOCUMENTS 5,177,567  1/1993  Klersy et al. ..................... 257/4
5,536,947  7/1996  Klersy et al. ..................... 257/3

*Primary Examiner*—Joseph A. Popek
*Attorney, Agent, or Firm*—David W. Schumaker; Marvin S. Siskind; Marc J. Luddy

[57] ABSTRACT

An electrically operated, directly overwritable, multibit, single-cell chalcogenide memory element with multibit storage capabilities and having at least one contact for supplying electrical input signals to set the memory element to a selected resistance value, the second contact tapering to a peak adjacent to the memory element. In this manner the tapered contact helps define the size and position of a conduction path through the memory element.

17 Claims, 3 Drawing Sheets

MULTIBIT SINGLE CELL MEMORY ELEMENT HAVING TAPERED CONTACT

FIELD OF THE INVENTION

The present invention relates generally to a uniquely designed solid state, electrically and optically operated, directly overwritable, low energy, very fast switching, non-volatile, analogue and multilevel single-cell operating memory element, and to high density electrical memory arrays fabricated from these elements. More specifically, the present invention relates to a memory element having a tapered contact layer.

BACKGROUND AND PRIOR ART

The Ovonic EEPROM is a novel, proprietary, high performance, non-volatile, thin-film electronic memory device. Its advantages include non-volatile storage of data, potential for high bit density and, consequently, low cost because of its small footprint and simple two-terminal device configuration, long reprogramming cycle life, low programming energies and high speed. The Ovonic EEPROM is capable of both analog and digital forms of information storage. Digital storage can be either binary (one bit per memory cell) or multi-state (multiple bits per cell). Only minor modifications are necessary to switch between the two digital modes. For purposes of the instant invention, the terms "memory elements" and "control elements" will be employed synonymously.

EARLY ELECTRICAL PHASE CHANGE MEMORY

The general concept of utilizing electrically writable and erasable phase change materials (i.e., materials which can be electrically switched between generally amorphous and generally crystalline states) for electronic memory applications is well known in the art, as is disclosed, for example, in U.S. Pat. No. 3,271,591 to Ovshinsky, issued Sep. 6, 1966 and in U.S. Pat. No. 3,530,441 to Ovshinsky, issued Sep. 22, 1970, both of which are assigned to the same assignee as the present invention, and both disclosures of which are incorporated herein by reference (hereinafter the "Ovshinsky patents").

As disclosed in the Ovshinsky patents, such phase change materials can be electrically switched between structural states of generally amorphous and generally crystalline local order or between different detectable states of local order across the entire spectrum between completely amorphous and completely crystalline states. That is, the Ovshinsky patents describe that the electrical switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The early materials described by the Ovshinsky patents could also, if required, be switched between just the two structural states of generally amorphous and generally crystalline local order to accommodate the storage and retrieval of single bits of encoded binary information.

In the typical personal computer there are often four tiers of memory. Archival information is stored in inexpensive, slow, high storage capacity, non-volatile devices such as magnetic tape and floppy disks. This information is transferred, as needed, to faster and more expensive, but still non-volatile, hard disk memories. Information from the hard disks is transferred, in turn, to the still more expensive, faster, volatile system memory which uses semiconductor dynamic RAM (DRAM) devices. Very fast computers even transfer forth and back small portions of the information stored in DRAM to even faster and even more expensive volatile static RAM (SRAM) devices so that the microprocessor will not be slowed down by the time required to fetch data from the relatively slower DRAM. Transfer of information among the tiers of the memory hierarchy occupies some of the computer's power and this need for "overhead" reduces performance and results in additional complexity in the computer's architecture. The current use of the hierarchal structure, however, is dictated by the price and performance of available memory devices and the need to optimize computer performance while minimizing cost.

The electrically erasable phase change memories described in the Ovshinsky patents, as well as subsequent electrical solid state memory, had a number of limitations that prevented their widespread use as a direct and universal replacement for present computer memory applications, such as tape, floppy disks, magnetic or optical hard disk drives, solid state disk flash, DRAM, SRAM, and socket flash memory. Specifically, the following represent the most significant of these limitations: (i) a relatively slow (by present standards) electrical switching speed, particularly when switched in the direction of greater local order (in the direction of increasing crystallization); (ii) a relatively high input energy requirement necessary to initiate a detectable change in local order; and (iii) a relatively high cost per megabyte of stored information (particularly in comparison to present hard disk drive media).

The most significant of these limitations is the relatively high energy input required to obtain detectable changes in the chemical and/or electronic bonding configurations of the chalcogenide material in order to initiate a detectable change in local order. Also significant were the switching times of the electrical memory materials described in the Ovshinsky patents. These materials typically required times in the range of a few milliseconds for the set time (the time required to switch the material from the amorphous to the crystalline state); and approximately a microsecond for the reset time (the time required to switch the material from the crystalline back to the amorphous state). The electrical energy required to switch these materials typically measured in the range of about a microjoule.

It should be noted that this amount of energy must be delivered to each of the memory elements in the solid state matrix of rows and columns of memory cells. Such high energy levels translate into high current carrying requirements for the address lines and for the cell isolation/address device associated with each discrete memory element. Taking into consideration these energy requirements, the choices of memory cell isolation elements for one skilled in the art would be limited to very large single crystal diode or transistor isolation devices, which would make the use of micron scale lithography and hence a high packing density of memory elements impossible. Thus, the low bit densities of matrix arrays made from this material would result in a high cost per megabyte of stored information.

By effectively narrowing the distinction in price and performance between archival, non-volatile mass memory and fast, volatile system memory, the memory elements of the present invention have the capability of allowing for the creation of a novel, non-hierarchal "universal memory system". Essentially all of the memory in the system can be low cost, archival and fast. As compared to original Ovshinsky-type phase change electrical memories, the memory materials described herein provide over six orders of magnitude faster programming time (less than 30 nanoseconds) and use extremely low programming energy (less than 0.1 to 2 nanojoules) with demonstrated long term stability and cyclability (in excess of 10 trillion cycles). Also, experimental results indicate that additional reductions in element size can increase switching speeds and cycle life.

In general, development and optimization of the class of chalcogenide memory materials has not proceeded at the same rate as other types of solid state electrical memories that now have substantially faster switching times and substantially lower set and reset energies. These other forms of memories typically employ one or two solid state microelectronic circuit elements for each memory bit (as many as three or four transistors per bit) in some memory applications. The primary "non-volatile" memory elements in such solid state memories, such as EEPROM, are typically floating gate field effect transistor devices which have limited re-programmability and which hold a charge on the gate of a field effect transistor to store each memory bit. Since this charge can leak off with the passage of time, the storage of information is not truly non-volatile as it is in the phase change media of the prior art where information is stored through changes in the actual atomic configuration or electronic structure of the chalcogenide material from which the elements are fabricated. These other forms of memories now enjoy acceptance in the marketplace.

In contrast to DRAM and SRAM, volatile memory devices, and other "flash" devices such as floating gate structures, no field effect transistor devices are required in the electrical memory devices of the present invention. In fact, the electrically erasable, directly overwritable memory elements of the present invention represent the simplest electrical memory device to fabricate, comprising only two electrical contacts to a monolithic body of thin film chalcogenide material and a semiconductor diode for isolation. As a result, very little chip "real estate" is required to store a bit of information, thereby providing for inherently high density memory chips. Further, and as described below, additional increases in information density can be accomplished through the use of multibit storage in each discrete memory cell.

The solid state, electronic memories presently in use are relatively expensive to manufacture, the cost being typically about eighty times the cost per bit of storage capacity in relation to magnetic disk storage. On the other hand, these solid state, electronic memories provide certain advantages over magnetic disk memories in that they have no moving parts, require less electrical energy to operate, are easy to transport and store, and are more versatile and adaptable for use with portable computers and other portable electronic devices. As a matter of fact, hard drive manufacturers are forecasting rapid growth in the use of ever smaller hard drives and eventually solid state memory storage in the portable computer field. In addition, these solid state memories are usually true random access systems as opposed to disk types which require physical movement of the disk head to the proper data track for accessing the desired memory location. However, in spite of such advantages, the higher cost of solid state electrically erasable memories have prevented them from enjoying a substantial share of the market now dominated by magnetic memory systems. Although solid state electrically erasable memories could potentially be manufactured at reduced cost, the overall price-to-performance ratio of these devices is inadequate for them to fully replace magnetic disk systems.

A recently developed memory device is the metal-amorphous silicon-metal (MSM) electrical memory switch. See Rose, et al, "Amorphous Silicon Analogue Memory Devices", *Journal of Non-Crystalline Solids*, 115(1989), pp.168–70 and Hajto, et al, "Quantized Electron Transport in Amorphous -Silicon Memory Structures", *Physical Review Letters*, Vol.66, No. 14, Apr. 8, 1991, pp. 1918–21. This MSM switch is fabricated by the deposition of specifically selected metallic contacts on either side of a p-type amorphous silicon (a-Si) thin film. The importance of the selection of the metallic contact materials will be discussed later. MSM memory switches are disclosed as exhibiting relatively fast (10–100 ns) analogue switching behavior for voltage pulses of from 1–5 volts, thereby providing a range of resistances of from about $10^3$ to about $10^6$ ohms to which they can be set in a non-volatile manner. As should be readily apparent to skilled practitioners in the art, the MSM memory switches of Rose, et al and Hajto, et al, although exhibiting electrical switching characteristics (i.e.,times, energies and resultant device resistance) similar to the electrical switching characteristics of the memory elements of the instant invention, there are actually significant operational differences therebetween.

The most significant electrical switching difference resides in the inability of the MSM memory switches to be directly overwritten. That is, the MSM switches cannot be modulated directly bidirectionally from any one resistance in the analogue range of resistances to any other resistance in that range without first being erased (set to a specific starting resistance or "starting state"). More specifically, the MSM switch must first be set to the high resistance state (erased) before said switch can be set to another resistance value within the analogue range. In contrast thereto, the memory elements of the instant invention do not require erasure before being set to another resistance in the range; i.e., they are directly overwritable.

Another significant difference in the electrical switching characteristics which exists between the MSM memory switches of Rose, et al and Hajto, et al and the electrical memory elements of the present invention is the bipolar behavior of the MSM switches. As is disclosed by Rose, et al, the MSM switches must be erased using electrical pulses of reverse polarity from those pulses used to write. Significantly, this reversal of polarity of the applied pulse is not required by the memory elements of the present invention, whether the instant memory elements are used for digital or analogue switching.

These differences in electrical switching characteristics between the MSM switches and the memory elements of the present invention are attributable to more than just a mere difference in material from which the elements are constructed. These differences are indicative of the fundamental differences in switching mechanisms which characterize the physics of operation of the two devices. As alluded to above and as disclosed in the aforementioned articles, the electrical switching characteristics of the MSM memory switches are critically dependent upon the particular metal(s) from which the contacts are fabricated. This is because these MSM switches require a very highly energetic "forming" process in which metal from at least one of the contacts is transported into and formed as an integral portion of the switch body. In this process, a plurality (at least 15 from FIG. 1 of the Rose, et al paper) of progressively increasing 300 nanosecond, 5–15 volt pulses are employed to form the switch. Rose, et al state: " . . . X-ray microanalysis studies of the devices have been carried out, and the top electrode material has been found embedded in a filamentary region of the a-Si. This suggests that the top metal becomes distributed in the filament, and may play a role in the mechanism of switching . . . " Rose, et al also specifically find that the dynamic range of the available resistances is determined by the metal from which the upper electrode contact is fabricated. As is stated by Rose, et al: . . . it is found that its value is entirely (sic) dependent on the top contact, and completely independent of the bottom metallisation (sic), i.e. Cr top electrode devices are always digital and V top electrode devices are always analogue irrespective of the bottom electrode. It is within this metallic filamentary region where the electrical switching occurs; and without this mass migration of metal into the a-Si, there would be no switching, see the Hajto, et al paper. In complete contradistinction thereto, the memory elements of the present invention do not require migration of the contact material into the thin-film memory element to achieve high speed, low energy, analogue, direct overwrite, memory switching. As a matter of fact, in the fabrication of the memory elements of the instant invention, great care is taken to prevent diffusion of metal from either of the electrodes into the active chalcogenide material.

From the foregoing analysis of Rose, et al and Hajto, et al, it should be clear that MSM memory switches do not, by any stretch of the imagination qualify as a modulator of free charge concentration. Rather, MSM memory switches simply rely upon the creation of a filamentary metallic pathway through the amorphous silicon material in order to obtain a range of resistivities in much the same way as a modulated switch is used to control the flow of electrical current. A percolation pathway is established, the diameter of which can be increased or decreased to change the resistivity thereof. No movement of Fermi level position is involved in the switching process. No change in activation of the semiconductor material need be invoked to explain the operation. No atomic scale movement of lone pairs of non-bonding electrons is present. Crystallite size and surface to volume ratio thereof is not important. But most importantly, it is impossible for Rose, et al and Hajto, et al to directly overwrite information stored in the cells of their memory material. The MSM switch requires stored information to be erased before new information can be written. It is not surprising that Rose, et al have asserted that their MSM switch is limited to one million cycles while the memory elements of the instant invention were cycled over 10 trillion cycles without failure prior to ending the test.

Simply stated, no solid state memory system developed prior to the present invention, regardless of the materials from which it was fabricated, has been inexpensive; easily manufacturable; non-volatile; electrically writable and directly erasable (overwritable) using low input energies; capable of multibit storage in a single cell (had a gray scale); and capable of very high packing density. The memory system described hereinbelow, because it addresses all of the deficiencies of known memory systems, will find immediate widespread use as a universal replacement for virtually all types of computer memory currently in the marketplace. Further, because the memories of the present invention can be fabricated in an all thin-film format, three-dimensional arrays are possible for high speed, high density neural network, and artificial intelligence applications. The memory system of the present invention is therefore uniquely applicable to neural networks and artificial intelligence systems because its multi-layer, three-dimensional arrays provide massive amounts of information storage that is rapidly addressable, thus permitting learning from stored information.

It is clear from the discussion above that the quantitative changes in switching speed and energy requirements of the memories of the present invention, as compared to the phase change memories of the prior art, demonstrate that those memories define an entirely new class of modulatable semiconductor material. In addition, the prior art has no analog to the direct overwrite, wide dynamic range and multibit storage capabilities of the instant memory elements.

As should be abundantly clear to ordinarily skilled artisans, in order to address the flash EEPROM market and be seriously considered as a universal memory, it is essential that memory elements be truly non-volatile. This is even more significant if the memory element is claimed to possess multibit storage capabilities. If a set resistance value is lost or even found to significantly drift over time, the information stored therein is destroyed, users lose confidence in the archival capabilities of the memory and the technology loses all credibility.

In addition to set resistance stability, another highly important factor which would be required of a universal memory is low switching current. This is extremely significant when the EEPROMs are used for large scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the comparatively large power consumption of the mechanical systems. In the case of lap-top computers, this is of particular interest because the mechanical hard disk drive is one of the largest power consumers therein. Therefore, it would be especially advantageous to reduce this power load, thereby substantially increasing the usage time of the computer per charge of the power cells. However, if the EEPROM replacement for mechanical hard drives has high switching energy requirements (and therefore high power requirements), the power savings may be inconsequential or at best unsubstantial. Therefore, any EEPROM which is to be considered a universal memory requires low switching energy.

Yet another requirement of a EEPROM universal memory is high thermal stability of the information stored therein. Today's computers, especially personal computers, are routinely subjected to high temperatures. These high temperatures can be caused by internally created heat such as from power sources or other heat producing internal components. These high temperatures may also be caused by environmental factors, such as use of the computer in a hot climate or storage of the computer in an environment which is directly or indirectly heated to higher than normal temperatures. Whatever the cause of the elevated temperatures, present computer memory systems, especially "hard" or archival memory, must be thermally stable even at relatively high temperatures. Without this thermal stability data loss may occur leading to the aforementioned loss of credibility.

Still another requirement of a EEPROM universal memory is long write/erase cycle life. For EEPROMs, as is the case with all archival memory, cycle life plays an important role in consumer confidence and acceptance. If the cycle life of a memory device is too short, the consumer will be adverse to using this device for fear of losing valuable data. If the EEPROM is to be used as a replacement for computers main memory or display memory, that is, as a replacement for DRAM, SRAM or VRAM, the requirement of long cycle life is even more critical. The main and display memory are a computer's most often written to/erased data storage area. Every time a new computer program is loaded, a portion of the computer's main memory is erased and rewritten. During the execution of a computer program, a portion of the computer's main memory is constantly being cycled. Every time the computer monitor's display is changed, portions of the display memory are cycled. If the EEPROMs used to replace the computer's main and display memory do not have a relatively long write/erase cycle life, these memories would need to be replaced excessively. This would lead to excessive costs to the consumer and therefore loss of consumer confidence.

SUMMARY OF THE INVENTION

There is disclosed herein an electrically operated, directly overwritable, multibit, single-cell memory element comprising a volume of memory material defining a single cell memory element, the memory material characterized by (1) a large dynamic range of electrical resistance values, and (2) the ability for at least a filamentary portion of the memory material to be set to one of a plurality of resistance values within the dynamic range in response to selected electrical input signals so as to provide the single-cell memory element with multibit storage capabilities. At least a filamentary portion of the single cell memory element being setable, by the selected electrical signal to any resistance value in the dynamic range, regardless of the previous resistance value of the material.

The memory element further comprises a first spacedly disposed contact for supplying the electrical input signal to set the memory material to a selected resistance value within the dynamic range, and a second spacedly disposed contact for supplying the electrical input signal to set the memory material to a selected resistance value within the dynamic range, the second contact tapering to a peak adjacent to the memory element, the peak defining the size and position of the filamentary portion during electrical formation of the memory element.

DETAILED DESCRIPTION OF THE INVENTION

Figure 1:
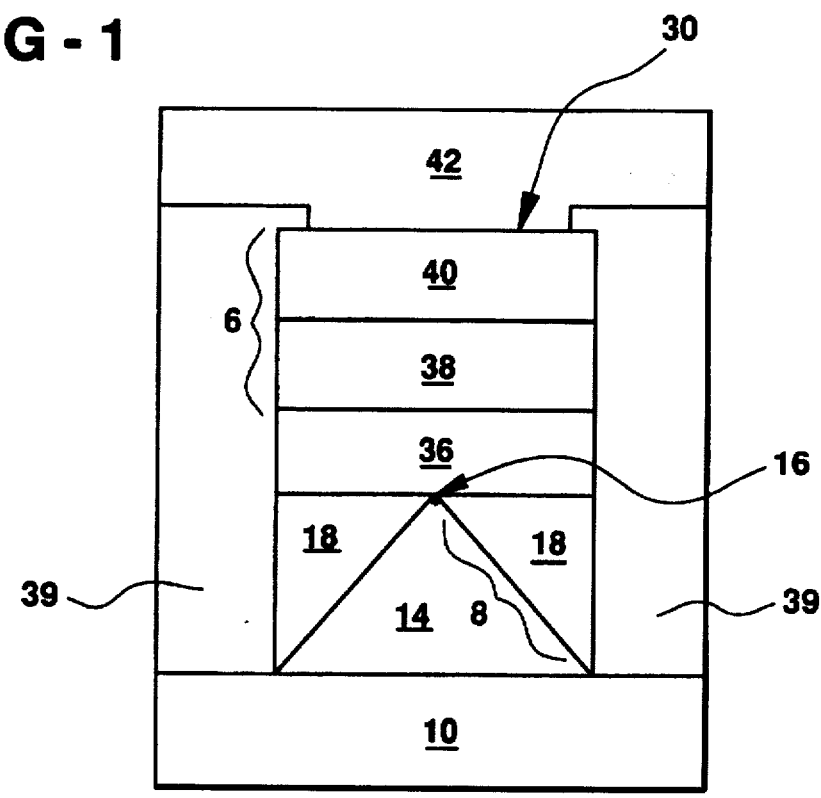
FIG. 1 is a cross-sectional view of a single memory element depicting a second contact that tapers to a peak adjacent to the memory material.

Erasable electrical memories fabricated from the broad class of chalcogenide materials have employed structural changes that were accommodated by movement of certain atomic species within the material to permit change of phase as the material switched from the amorphous state to the crystalline state. For example, in the case of electrically switchable chalcogenide alloys formed of tellurium and germanium, such as those comprising about 80% to 85% tellurium and about 15% germanium along with certain other elements in small quantities of about one to two percent each, such as sulfur and arsenic, the more ordered or crystalline state was typically characterized by the formation of a highly electrically conductive crystalline Te filament within the switchable pore of the memory material. A typical composition of such a prior art material would be, for example, $Te_{81}Ge_{15}S_2As_2$ or $Te_{81}Ge_{15}S_2Sb_2$. Because Te is so highly conductive in its crystalline state, a very low resistance condition was established through the Te filament in the more ordered or crystalline state; this resistance being a number of orders of magnitude lower than the resistance of the pore in the less ordered or amorphous state.

However, the formation of the conductive Te filament in the crystalline state required migration of the Te atoms from their atomic configuration in the amorphous state to the new locally concentrated atomic configuration in the crystalline Te filament state. Similarly, when the chalcogenide filamentary material was switched back to the amorphous state, the Te which had precipitated out into the crystalline filament was required to migrate within the material from its locally concentrated form in the filament back to its atomic configuration in the amorphous state. This atomic migration, diffusion or rearrangement between the amorphous and crystalline states required in each case a holding or dwell time of sufficient length to accommodate the migration, thereby making the requisite switching time and energy relatively high.

The subject inventors have discovered a remarkable reduction in both the required switching time and the energy input for a fundamentally different type of electrically erasable, directly overwritable memory based up on a new class of chalcogenide semiconductor materials. Moreover, the chalcogenide materials provides for switching within a wide dynamic range of stable states with remarkably low energy inputs at remarkably fast speeds so that this newly discovered class of materials can be used to fabricate improved electrical memory elements.

Specifically, the memory material can be switched between electrically detectable conditions of varying resistance in nanosecond time periods (the minimum switching speed and minimum energy requirements have not as yet been ascertained, however, experimental data as of the filing of this application have shown that the electrical memory can be modulated (even though not optimized) with as short as 1 nanosecond programming pulses) with the input of picojoules of energy. This memory material is non-volatile and will maintain the integrity of the information stored by the memory cell (within a selected margin of error) without the need for periodic refresh signals. In contrast to many other semiconductor materials and systems heretofore specified for memory applications, the semiconductor memory material and systems of the present invention can be directly overwritable so that the discrete memory elements need not be erased (set to a specified starting point) in order to change information stored there. The remarkably fast and low energy switching to any of the different values of resistance can be attributed to the fact that said switching occurs without the need for gross atomic rearrangement of the switching material.

The memory material is formed from a plurality of constituent atomic elements, each of which is present throughout the entire volume of memory material. The plurality of constituent atomic elements preferably includes at least one chalcogen element and may include at least one transition metal element. The term "transition metal" as used herein includes elements 21 to 30, 39 to 48, 57 and 72 to 80. More preferably, the plurality of constituent atomic elements which form the volume of memory material includes elements selected from the group consisting of Te, Se, Ge, Sb, Bi, Pb, Sn, As, S, Si, P, O and mixtures or alloys thereof. More preferably the transition metal includes Cr, Fe, Ni and mixtures of alloys thereof and the chalcogen element includes Te and Se. Most preferably the transition metal is Ni. Specific examples of such multi-element systems are set forth hereinafter with respect to the Te:Ge:Sb system with or without Ni and/or Se.

Regardless of the explanation of the manner in which programming is accomplished, the present invention provides a combination of valuable electrical switching characteristics never before available in a single memory element.

The specific semiconductor alloys employed in fabricating the memory devices include chalcogenide elements which are particularly noted for the presence of "lone pair" electrons. It is therefore necessary to discuss the effect of those lone pair electrons in available chemical bonding configurations. Simply stated, a lone pair is a pair of electrons in the valence shell of an atom that is typically not engaged in bonding. Such lone pair electrons are important both structurally and chemically. They influence the shape of molecules and crystalline lattice structures by exerting strong repulsive forces on neighboring electron pairs which are engaged in bonding configurations and as well as on other lone pairs. Since lone pair electrons are not tied down into a bonding region by a second nucleus, they are able to influence and contribute to low energy electronic transitions. As first pointed out by Ovshinsky, the lone pairs can have 1 and 3 center bonding; and as demonstrated by Kastner, Adler and Fritsche, they have valance alternation pairs.

Specifically, the tellurium alloys described herein have a valence band made up of lone pair states. Since four (4) p shell electrons are present in Te, and the Te atom is chemically bonded by two of these bonding electrons in the p shell, the other two outer electrons (the lone pair) are not utilized for bonding purposes and hence do not substantially change the atomic energy of the system. In this regard, note that the highest filled molecular orbital is the orbital which contains the lone pair electrons. This is significant because, in a perfect stoichiometric crystal of tellurium and germanium atoms, upon the application of some internal strain in the lattice from which the crystallite is formed, the valence band can broaden and move upward toward the position of the then existing Fermi level. However, TeGe crystals are naturally "self-compensated", that is, the crystal desires to preferentially assume a Te rich (approximately 52 percent Te and 48 percent Ge) composition. The stoichiometric crystal is a face centered cube; however, with the addition of a minimal amount of energy, the crystal can assume a rhombohedral lattice structure by increasing the number of its Ge and/or Sb vacancies. It is this creation of vacancies in the crystalline lattice structure, which can reduce lattice strain in TeGe alloys, is responsible for lowering the energy state of the material and moves the Fermi level toward the valence band.

It is acceptable, if not essential to superimpose an amorphous model of local order on top of a short range local order model for the purpose of obtaining a descriptive, if not perfectly predictive explanation of atomic behavior. When considering the amorphous nature of the material, note that the density of defect states in the band tails is greatest adjacent the band edges, while the depth of the recombination centers for captured charge carriers are deeper farther away from the band edges. The presence of these deep traps and tail states would provide a possible explanation for intermediate stable resistance values between the Fermi level position and the band edge. Regardless of theory, when fully crystalline, the semiconductor material of the instant invention is a degenerate semiconductor which exhibits metallic-like conduction.

It is further believed that the size of the crystallites which exist in the bulk of the semiconductor and memory material is relatively small, preferably less than about 2000 Å, more preferably between about 50 Å and 500 Å, and most preferably on the order of about 200 Å to about 400 Å. Further, these crystallites are believed to be surrounded by an amorphous skin which may contribute to the rapid formation of the many Fermi level positions of the material, detectable as different resistances (conductivities), as well as to the lower energy requirements for the transitions between these detectable resistance values to which the material can be reliably and repeatably set.

It has also been found that modulation of the switching characteristics of two or three terminal semiconductor devices fabricated from the microcrystalline materials of the present invention may be controlled such that repeatable and detectable resistance values can be effected. It has been found that, in order for the materials of the present invention to be quickly set by low energy input signals to a desired conductivity (determined by the Fermi level position), it is only necessary that said materials are capable of stable (or long lived metastable) existence within at least two different Fermi level positions, which Fermi level positions are characterized by substantially constant band gaps but different electrical conductivities. As noted above, it is also believed that the relatively small crystallite size may contribute to the rapid transition between detectable values of resistance.

One characteristic of the semiconductor materials of the present invention is their tendency toward the formation of more and smaller crystallites per unit volume. Crystallite sizes of the widest preferential range of representative materials embodying the present invention have been found to be far less than about 2000 Å, and generally less than the range of about 2,000 Å to 5,000 Å which was characteristic of prior art materials. Crystallite size is defined herein as the diameter of the crystallites, or of their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior art electrically erasable memory materials. In one composition that provides substantially improved electrical switching performance characteristics, the average concentration of Te in the as deposited materials was well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. The percentages given are atomic percentages which total 100% of the atoms of the constituent elements. Thus, this composition may be characterized as $Te_aGe_bSb_{100-(a+b)}$. These ternary Te—Ge—Sb alloys are useful starting materials for the development of additional memory materials having even better electrical characteristics.

Figure 6:
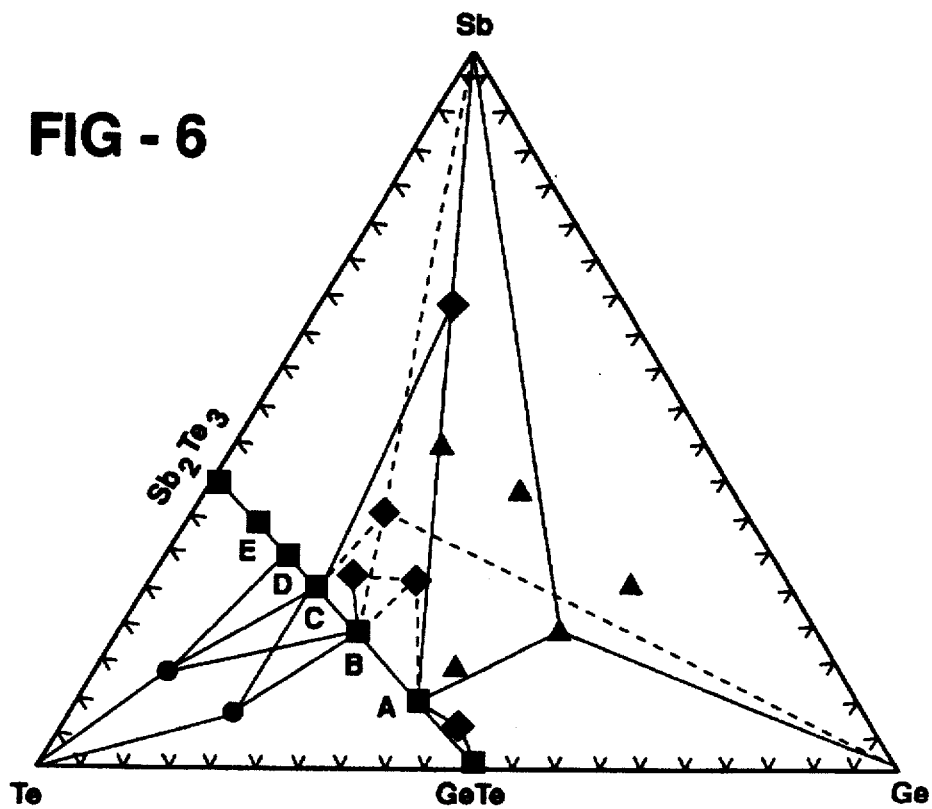
FIG. 6 is a ternary phase diagram of the Ge:Sb:Te alloy system from which the memory elements of the instant invention are fabricated, said phase diagram showing some of the multiple phases into which various mixtures of these elements segregate upon rapid solidification.

A ternary diagram of the Te:Ge:Sb system is shown in FIG. 6. Melts were prepared from various mixtures of Te, Ge and Sb, the melts segregated into multiple phases upon rapid solidification. Analysis of these rapidly solidified melts indicated the presence of ten different phases (not all present in any one rapidly solidified melt). These phases are: elemental Ge, Te and Sb, the binary compounds GeTe, and $Sb_2Te_3$ and five different ternary phases. The elemental compositions of all of the ternary phases lie on the pseudo-binary GeTe—$Sb_2Te_3$ line and are indicated by the reference letters A, B, C, D and E on the ternary diagram shown in FIG. 6. The atomic ratios of the elements in theses five ternary phases are set forth in Table 1. A more detailed description of FIG. 6 is presented hereinbelow

TABLE 1

Observed Ternary Crystalline Phases of the TeGeSb System

| Designation | At % Ge | At % Sb | At % Te |
|---|---|---|---|
| A | 40 | 10 | 50 |
| B | 26 | 18 | 56 |
| C | 18 | 26 | 56 |
| D | 14 | 29 | 57 |
| E | 8 | 35 | 56 |

The novel memory elements of the present invention include a volume of memory material, said memory material preferably including at least one chalcogen and can include one or more transition metals. The memory materials which include transition metals are elementally modified forms of our memory materials in the Te—Ge—Sb ternary system. That is, the elementally modified memory materials constitute modified forms of the Te—Ge—Sb memory alloys. This elemental modification is achieved by the incorporation of transition metals into the basic Te—Ge—Sb ternary system, with or without an additional chalcogen element, such as Se. Generally the elementally modified memory materials fall into two categories.

The first category is a memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. The transition metal preferably includes Cr, Fe, Ni, Nb, Pd, Pt and mixtures or alloys thereof.

Specific examples of memory materials encompassed by this system would include $(Te_{56}Ge_{22}Sb_{22})_{95}Ni_5$, $(Te_{56}Ge_{22}Sb_{22})_{90}Ni_{10}$, $(Te_{56}Ge_{22}Sb_{22})_{95}Cr_5$, $(Te_{56}Ge_{22}Sb_{22})_{90}Cr_{10}$, $(Te_{56}Ge_{22}Sb_{22})_{95}Fe_5$, $(Te_{56}Ge_{22}Sb_{22})_{90}Fe_{10}$, $(Te_{56}Ge_{22}Sb_{22})_{95}Pd_5$, $(Te_{56}Ge_{22}Sb_{22})_{90}Pd_{10}$, $(Te_{56}Ge_{22}Sb_{22})_{95}Pt_5$, $(Te_{56}Ge_{22}Sb_{22})_{95}Pt_{10}$, $(Te_{56}Ge_{22}Sb_{22})_{95}Nb_5$, $(Te_{56}Ge_{22}Sb_{22})_{90}Nb_{10}$, $(Te_{56}Ge_{22}Sb_{22})_{90}Ni_5Cr_5$, $(Te_{56}Ge_{22}Sb_{22})_{90}Ni_5Fe_5$, $(Te_{56}Ge_{22}Sb_{22})_{90}Cr_5Fe_5$, $(Te_{56}Ge_{22}Sb_{22})_{90}Pd_5Cr_5$, $(Te_{56}Ge_{22}Sb_{22})_{90}Ni_5Pd_5$, $(Te_{56}Ge_{22}Sb_{22})_{90}Pd_5Pt_5$, etc.

The second category is a memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. The transition metal can preferably include Cr, Fe, Ni, Pd, Pt, Nb and mixtures of alloys thereof. Specific examples of memory materials encompassed by this system would include $(Te_{56}Ge_{22}Sb_{22})_{90}Ni_5Se_5$, $(Te_{56}Ge_{22}Sb_{22})_{80}Ni_{10}Se_{10}$, $(Te_{56}Ge_{22}Sb_{22})_{90}Cr_5Se_5$, $(Te_{56}Ge_{22}Sb_{22})_{80}Cr_{10}Se_{10}$, $(Te_{56}Ge_{22}Sb_{22})_{90}Fe_5Se_5$, $(Te_{56}Ge_{22}Sb_{22})_{80}Fe_{10}Se_{10}$, $(Te_{56}Ge_{22}Sb_{22})_{90}Pd_5Se_5$, $(Te_{56}Ge_{22}Sb_{22})_{80}Pd_{10}Se_{10}$, $(Te_{56}Ge_{22}Sb_{22})_{90}Pt_5Se_5$, $(Te_{56}Ge_{22}Sb_{22})_{80}Pt_{10}Se_{10}$, $(Te_{56}Ge_{22}Sb_{22})_{90}Nb_5Se_5$, $(Te_{56}Ge_{22}Sb_{22})_{80}Nb_{10}Se_{10}$, $(Te_{56}Ge_{22}Sb_{22})_{85}Ni_5Cr_5Se_5$, $(Te_{56}Ge_{22}Sb_{22})_{80}Ni_5Fe_5Se_{10}$, $(Te_{56}Ge_{22}Sb_{22})_{85}Cr_5Fe_5Se_5$, $(Te_{56}Ge_{22}Sb_{22})_{85}Ni_5Pd_5Se_5$, $(Te_{56}Ge_{22}Sb_{22})_{80}Ni_5Pt_5Se_{10}$, $(Te_{56}Ge_{22}Sb_{22})_{85}Ni_5Nb_5Se_5$, $(Te_{56}Ge_{22}Sb_{22})_{85}Pd_5Cr_5Se_5$, $(Te_{56}Ge_{22}Sb_{22})_{80}Pd_5Pt_5Se_{10}$, $(Te_{56}Ge_{22}Sb_{22})_{85}Pd_5Nb_5Se_5$, $(Te_{56}Ge_{22}Sb_{22})_{85}Pt_5Nb_5Se_5$, etc.

The memory elements of the instant patent application possess substantially non-volatile set resistance values. However, if the resistance value of the instant memory elements does, under some circumstances, drift from its original set value, "compositional modification", described hereinafter, may be used to eliminate for this drift. As used herein, the term "non-volatile" will refer to the condition in which the set resistance value remains substantially constant for archival time periods. Of course, software (including the feedback system discussed hereinafter) can be employed to insure that absolutely no "drift" occurs outside of a selected margin of error. Because drift of the resistance value of the memory elements can, if left unimpeded, hinder gray scale storage of information, it is desirable to minimize drift.

"Compositional modification" is defined herein to include any means of compositionally modifying the memory material to yield substantially stable values of resistance, including the addition of band gap widening elements to increase the inherent resistance of the material. One example of compositional modification is to include graded compositional inhomogeneities with respect to thickness. For instances, the volume of memory material may be graded from a first Te—Ge—Sb alloy to a second Te—Ge—Sb alloy of differing composition. The compositional grading may take any form which reduces set resistance value drift. For example, the compositional grading need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of memory material. That is, the volume of memory material may be formed of a plurality of discrete, relatively thin layers of differing composition. For example, the volume of memory material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volumes of memory material which employ this combination are: (1) a volume of memory material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of memory material which includes a discrete layer of $Ge_{14}Sb_{29}Te_{57}$ and a graded composition of $Ge_{14}Sb_{29}Te_{57}$ and $Ge_{22}Sb_{22}Te_{56}$.

Referring to FIG. 1, shown is a cross-sectional view of a memory element of the present invention formed on a single crystal silicon semiconductor wafer 10. The memory element includes the memory material 36, a first spacedly disposed contact 6, and a second spacedly disposed contact 8. Both the first and second spacedly disposed contacts are used for supplying the electrical input signal to the memory material.

First contact 6 can be comprised of two thin-film layers. Thin-film layer 38, deposited adjacent to the memory material 36 has excellent diffusion barrier properties which inhibits the diffusion and electromigration of foreign material into the chalcogenide memory material 36.

The adjacent thin-film layer 38 may be comprised of a carbon material such as amorphous carbon. Alternately, the adjacent thin-film layer 38 may be formed from a compound which includes one element selected from the group consisting of Ti, V, Cr, Zr, Nb, M. Hf, Ta, W, and two or more elements selected from the group consisting of B, C, N, Al, Si, P, S. Preferably, the adjacent thin-film layer 38 is formed from a compound which includes Ti and two or more elements selected from the group consisting of C, N, Al, Si and mixtures or alloys thereof. In one embodiment, the adjacent thin-film layer is comprised of a compound having a composition of, in atomic percent, between about 10% to 60% titanium, 5% to 50% carbon and 10% to 60% nitrogen. In addition, the titanium carbonitride may also include up to 40% hydrogen.

In another embodiment, the adjacent thin-film layer 38 is comprised of titanium siliconitride. Preferably, in this embodiment, the adjacent thin-film layer is comprised of a compound having a composition of, in atomic percent, between about 10% to 60% titanium, 5% to 50% silicon and 10% to 60% nitrogen.

In a third embodiment, the adjacent thin-film layer 38 is comprised of titanium aluminum nitride. Preferably, in this embodiment, the adjacent thin-film layer is comprised of a compound having a composition of, in atomic percent, between about 10% to 60% titanium, 5% to 50% aluminum and 10% to 60% nitrogen.

The titanium carbonitride, titanium siliconitride and titanium aluminum nitride have excellent barrier properties, preventing both the diffusion and electromigration of foreign material into the chalcogenide memory material. Furthermore, the titanium carbonitride, titanium siliconitride and titanium aluminum nitride may be deposited by such methods as physical vapor deposition including evaporation, ion plating as well as DC and RF sputtering deposition, chemical vapor deposition, and plasma assisted chemical vapor deposition. The exact method used depends upon many factors, one of which being deposition temperature constraints imposed by the composition of the chalcogenide target material.

The adjacent thin-film layer 38 is preferably deposited to a thickness of about 100 Å to 2000 Å. The adjacent thin-film layer 38 is more preferably deposited to a thickness of about 200 Å to 1000 Å.

First contact 6 can further comprise an additional thin-film layer 40 deposited remote to the chalcogenide memory material. The remote thin-film layer is comprised of one or more elements from the group consisting of Ti, W and Mo. In one embodiment, the remote thin-film layer is comprised of Ti and W. Preferably, the remote thin-film layer is comprised of a compound, in atomic percent, of 5% to 30% titanium and 70% to 95% tungsten. The remote thin-film layer Ti—W alloy is preferably deposited using a DC sputtering deposition process. It is preferably deposited to a thickness of about 100 Å to 4000 Å. It is more preferably deposited to a thickness of about 200 Å to 2000 Å. The Ti—W alloy has excellent ohmic contact properties. Moreover, it has the barrier properties necessary to prevent both the electromigration and diffusion of foreign electrode material into the chalcogenide memory material.

FIG. 1 shows an embodiment of the second contact 8 which tapers in cross-sectional area to a peak 16 that is adjacent to memory material 36. In this embodiment, the second contact comprises a "contact tip" 14 that can be formed on the silicon substrate 10. The contact tip 14 can be formed in a multi-step process. A patterned oxide layer can be formed on silicon substrate 10 using conventional oxidation and photolithographic techniques. Using the oxide layer as a mask, the silicon substrate is anisotropically etched to form the elongated, tapered structure on top of the silicon substrate 10 that is referred to as a contact tip. Contact tips can be fabricated so that they are conical, pyramidal, elongated or wedge-shaped. Other shapes that come to a point contact with the chalcogenide material are also possible without departing from the spirit or scope of the instant invention.

The peak of the second contact can be pointed. Pointed peaks are fabricated by sharpening the contact tips that are etched from the silicon substrate. Sharpening uses a reactive process which includes but is not limited to plasma etching, wet chemical etching or thermal oxidation. Contact tips may also be sharpened electrochemically, for example by placing a bias on a solution, and depositing or etching the contact tips. This process may be used to sharpen molybdenum, tungsten or precious metal contact tips such as platinum, pallium, iridium or gold.

While it is preferred that the peaks are pointed, they need not be atomically sharp. Peaks which are rounded or flat will also suffice provided the cross-sectional diameter of each peak is sufficiently small. Preferably, the cross-sectional diameter of the peak is less than 2000 Å. More preferably, the diameter of the cross-sectional area of the peak is less than 1000 Å. Most preferably, the diameter of the cross-sectional area of the peak is less than 500 Å. Contact tips which are formed having flat peaks can be fabricated as conical, pyramidal, elongated or wedge-shaped frustums. In the most preferable embodiment, the diameter of the peak will approximate the diameter of the filamentary pore (the conduction path) formed through the body of chalcogenide material.

Figure 2:
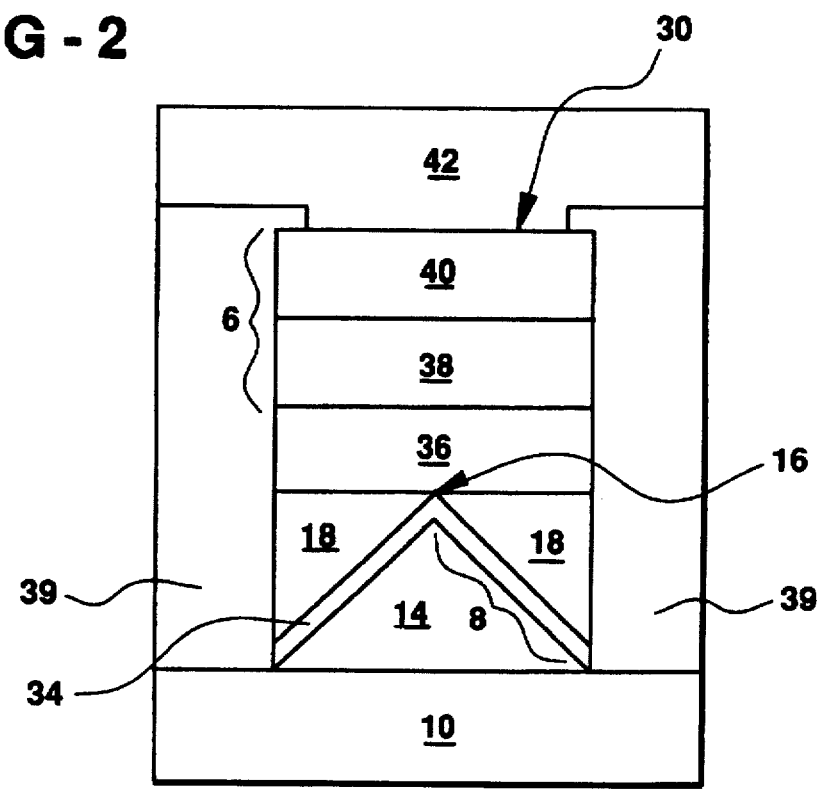
FIG. 2 is a cross-sectional view of a single memory element depicting a second contact comprising an additional thin-film layer of carbon material.

FIG. 2 shows another embodiment of second contact 8 in which second contact 8 includes a "first" thin-film layer 34. The first thin-film layer is deposited on top of contact tip 14.

The first thin-film layer 34 may be comprised of a carbon material such as amorphous carbon. Alternately, the first thin-film layer 34 may be formed from a compound which includes one element selected from the group consisting of Ti, V, Cr, Zr, Nb, M. Hf, Ta, W, and two or more elements selected from the group consisting of B, C, N, Al, Si, P, S. Preferably, the first thin-film layer 34 is formed from a compound which includes Ti and two or more elements selected from the group consisting of C, N, Al, Si and mixtures or alloys thereof.

In one embodiment, the first thin-film layer 34 is comprised of a compound having a composition of, in atomic percent, between about 10 to 60% titanium, 5 to 50% carbon and 10 to 60% nitrogen. In addition, the titanium carbonitride may also include up to 40% hydrogen.

In another embodiment, the first thin-film layer 34 is comprised of titanium siliconitride. Preferably, in this embodiment, the adjacent thin-film layer is comprised of a compound having a composition of, in atomic percent, between about 10 to 60% titanium, 5 to 50% silicon and 10 to 60% nitrogen.

In another embodiment, the first thin-film layer 34 may be comprised of titanium aluminum nitride. Preferably, the first thin-film layer is comprised of a compound having a composition of, in atomic percent, between about 10 to 60% titanium, 5 to 50% aluminum and 10 to 60% nitrogen.

The cross-sectional area of the peak of a second contact that includes a first thin-film layer must be kept sufficiently small. As discussed above, preferably, the cross-sectional diameter of the peak is less than 2000 Å. More preferably, the diameter of the cross-sectional area of the peak is less than 1000 Å. Most preferably, the diameter of the cross-sectional area of the peak is less than 500 Å.

Alternately, the second contact 8 may comprise two thin-film layers, a first and a second thin-film layer. The first thin-film layer is the same as described above. The second thin-film layer may be comprised of one or more elements from the group consisting of Ti, W and Mo. In one embodiment, the second thin-film layer is comprised of Ti and W. Preferably, the second thin-film layer is comprised of a compound, in atomic percent, of 5% to 30% titanium and 70% to 95% tungsten. The two thin-film layers are arranged such that the second thin-film layer is deposited on top of the contact tip and the first thin-film layer is deposited on top of the second thin-film layer.

An alternate structure for the second contact 8 is one in which the contact tip is offset from the silicon substrate by an elongated column. The elongated column is used to increase the distance, and hence reduce the parasitic capacitance, between the conducting electrodes that are used to supply current to the memory elements. Columns may be made of metal (for example sputtered tungsten, single crystal metal such as tungsten or a sputtered titanium-tungsten alloy), conductive ceramic, silicon (doped or undoped), other semiconductor materials or other materials.

The spaces formed in the silicon substrate 10 by the etching process are filled by depositing a suitable dielectric 18 on top of the second contact. Examples of suitable dielectric materials that may be used are TeOS, $SiO_2$ or $Si_3N_4$. After deposition of the dielectric material 18, the surface is planarized using chemical mechanical polishing (CMP) techniques.

After CMP, a layer of chalcogenide memory material is then deposited on top of the planarized surface. The layer of memory material 36 is formed of a multi-element semiconductor material, such as the chalcogenide materials disclosed herein. The layer 36 may be deposited by methods such as sputtering, evaporation or by chemical vapor deposition (CVD), which may be enhanced by plasma techniques such as RF glow discharge. The chalcogenide memory materials of the instant invention are most preferably made by RF sputtering and evaporation. Typical deposition parameters for RF sputtering and evaporation of the chalcogenide layer 36 are set forth below in Tables 2 and 3, respectively.

TABLE 2

| RF Sputtering Deposition Parameters | |
|---|---|
| Parameter | Typical Range |
| Base pressure | $8 \times 10^{-7} - 1 \times 10^{-6}$ Torr |
| Sputtering gas (Ar) pressure | 4–8 m Torr |
| Sputtering power | 40–60 watts |
| Frequency | 13–14 MHz |
| Deposition Rate | 0.5–10 Å/second |
| Deposition Time | 2–25 minutes |
| Film Thickness | 250–1500 Å |
| Substrate Temp. | Ambient–300° C. |

TABLE 3

| Evaporation Deposition Parameters | |
|---|---|
| Parameter | Typcal Range |
| Base pressure | $1 \times 10^{-6} - 5 \times 10^{-6}$ Torr |
| Evaporation Temp. | 450–600° C. |
| Deposition Rate | 2–4 Å/second |
| Deposition Time | 2–20 minutes |
| Film Thickness | 250–1500 Å |
| Substrate Temp. | Ambient–300° C. |

It is important to note that evaporated films deposited on a heated substrate exhibit anisotropic growth characteristics (see the description of FIG. 7) in which oriented layers of the chalcogenide elements are successively deposited. Whether this proves to be significant for electrical applications has yet to be proven; however, this type of film holds promise for thermoelectricity (due to the high thermopower already measured for these compositions, i.e., a factor of four greater than that measured for bismuth systems) or for specific semiconductor and superconductivity applications. The layer of memory material 36 is preferably deposited to a thickness of about 200 Å to 5,000 Å, more preferably of about 250 Å to 2,500 Å and most preferably of about 400 Å to 1,250 Å in thickness.

Deposited on top of the entire structure is a layer of insulating material 39. Examples of insulating material that can be used are $SiO_2$, $Si_3N_4$ or TeOS. This layer of insulating material is then etched and a layer of aluminum is deposited to form the second electrode grid structure 42 which extends perpendicular in direction to the conductors 12 and complete the X-Y grid connection to the individual memory elements. Overlaying the complete integrated structure is a top encapsulating layer of a suitable encapsulant such as $Si_3N_4$ or a plastic material such as polyamide, which seals the structure against moisture and other external elements which could cause deterioration and degradation of performance. The $Si_3N_4$ encapsulant can be deposited, for example, using a low temperature plasma deposition process. The polyamide material can be spin deposited and baked after deposition in accordance with known techniques to form the encapsulant layer.

The term "pore diameter" as used herein is the average cross-section of the smallest region of contact between the memory material 36, and the electrical contacts 6 and 8. The pore diameter can be as small as lithography resolution limits will permit. Pore diameter is related to device performance. Reducing pore diameter reduces device volume. This increases the current density and energy density of the device, thus lowering the current and energy requirements needed for electrical switching. This increases the speed and sensitivity of the device—reducing the switching time and electrical energy required to initiate the detectable change in resistance.

It is preferred that the pore diameter be selected to conform substantially with the cross section of the memory material whose resistance is actually altered when the material is switched to either the high or low resistance state. This section of memory material is called the "filamentary portion". Ideally, the pore diameter should equal the diameter of the filamentary portion.

As a means of reducing pore diameter beyond that permitted by lithography, memory elements have employed "filament confining means" between at least one of the spacedly disposed contacts and the volume of memory material. The filament confining means is, typically, a thin-film layer of highly resistive material with at least one low resistance pathway thereacross through which current passes between the electrical contact and the volume of memory material.

The filament confining means defines the size and position of the filamentary portion within the memory material during both electrical formation as well as during switching of the memory element, thus providing a high current density within the filamentary portion upon input of a very low electrical current to the spacedly disposed contacts.

The filament confining means plays a role in the "electrical formation process" of the memory device. The electrical formation process consists of applying higher current electrical pulses to the newly constructed memory element until the memory element switches from its originally very high "virgin" resistance value to a lower resistance value. Once this occurs, the memory element is said to be "formed". It is now ready for subsequent lower current electrical cycling.

The formation process "breaks down" the filament confining means. During one or more of the higher current pulses applied during the formation process, the electrically weakest "breakdown" region in the confining layer is physically changed and becomes much more highly conductive than the remainder of the layer. It is through this region that all of the current of any subsequent memory cycling pulses (i.e. set and reset pulses) will pass. When a very low current is applied to the memory element, all of the current is channeled through the filamentary portion. Hence, because of its extremely small size, the current density is very high within this region of the memory material.

In the present invention, the second contact tapers in cross-sectional area to a peak that is adjacent to the memory material. In general, the smaller the area within a cross-section of a volume, the higher the current density within that cross-section. Hence, the small cross-sectional area at the peak creates a high current density at that location. A high current density is therefore applied to the small area of the memory material adjacent to the peak of the second contact.

The second contact thus serves a function similar to that of the filament confining means described above. As with the filament confining means, the second contact can define the size and position of the filamentary portion within the memory material during both electrical formation and during switching. Hence, the second contact of the present invention can be used to overcome the lithography limitations creating a small pore without the need of using an additional layer of material.

The specially designed second contact of the present invention can also lower the overall capacitance of the chalcogenide memory device. In contradistinction to a memory device having two parallel contacts, the tapered shape of the second contact increases the average distance between the two memory contacts. This increase in average distance, decreases the average electric field between the contacts which lowers both the capacitance and energy of the device.

Figure 3:
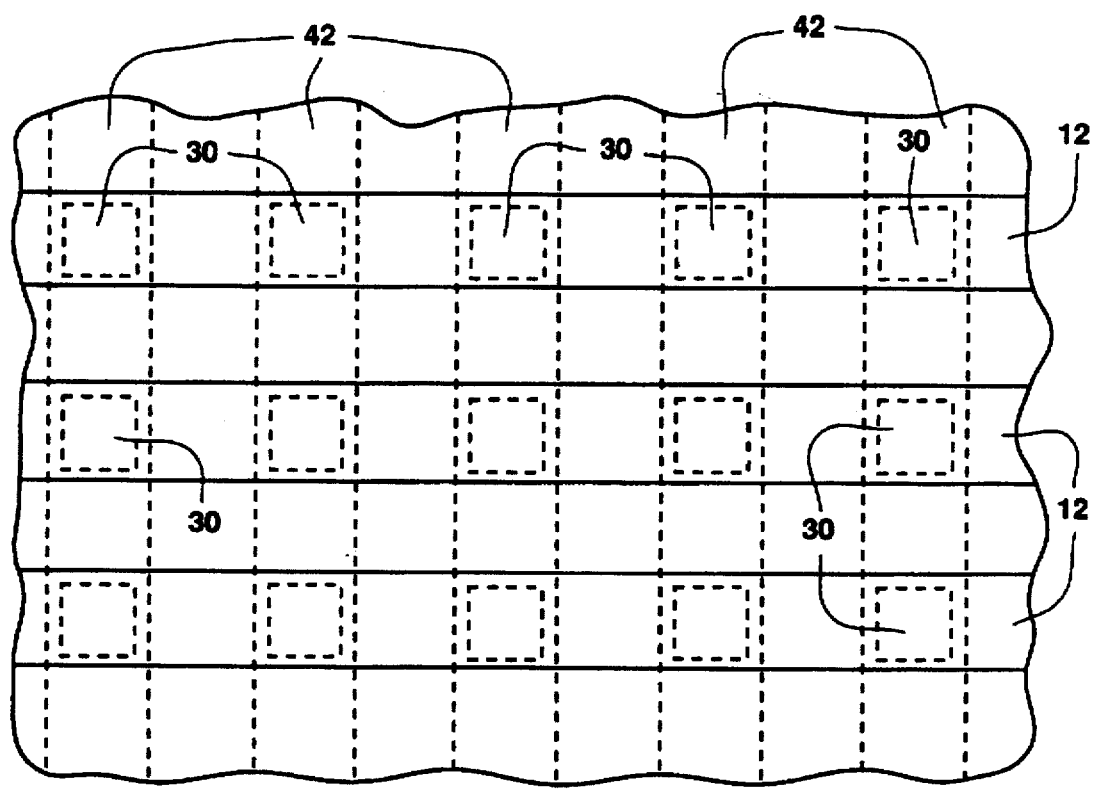
FIG. 3 is the top view of a possible layout of multiple memory elements showing how the elements would be connected to a set of X-Y addressing lines.

The top view of a possible configuration for multiple memory elements is shown in FIG. 3. As shown, the devices form an X-Y matrix of memory elements. The horizontal strips 12 represent the X set of an X-Y electrode grid for addressing the individual elements. The vertical strips 42 represent the Y set of addressing lines.

It is important to note that conventional CMOS technology cannot be used to produce this type of three dimensional memory array since CMOS technology builds the required semiconductor devices into the bulk of single crystal semiconductor wafers and, therefore, can only be used to fabricate a single layer of devices. Furthermore, (1) CMOS cannot produce as small of a footprint (actual element dimension) to effectively produce large arrays at comparably low cost and (2) CMOS devices, because they exist in a single plane, cannot be interconnected along the Z direction. Therefore, CMOS devices cannot be fabricated with the complex, three-dimensional interconnectivity required for advanced parallel processing computers. The three-dimensional, thin-film memory array structures of the instant invention, on the other hand are capable of both conventional serial information processing as well as parallel information processing.

Parallel processing and therefore multidimensional memory array structures are required for rapid performance of complex tasks such as pattern recognition, classification or associative learning etc. Further uses for and description of parallel processing are presented in U.S. Pat. No. 5,159, 661 which is assigned to the assignee of the instant application and the disclosure of which is hereby incorporated by reference. With the integrated structure as shown in the embodiment of FIG. 1; however, a completely vertically integrated memory structure can be formed, thus minimizing the area occupied on the substrate. This means that the density of the memory elements in the chip is limited essentially only by the resolution capabilities of the lithography.

Other circuit configurations for the electrically erasable memory of the present invention are, of course, possible and feasible to implement. One particularly useful configuration is a three dimensional, multilevel array in which a plurality of planes of memory or control elements and their respective isolation devices are stacked upon one another. Each plane of memory elements is arranged as a plurality of rows and columns of memory elements, thereby allowing for X-Y addressing. This stacking of planes, in addition to increasing memory storage density, allows for an additional Z dimension of interconnection. This arrangement is particularly useful to simulate a neural network for a truly intelligent computer.

Figure 4:
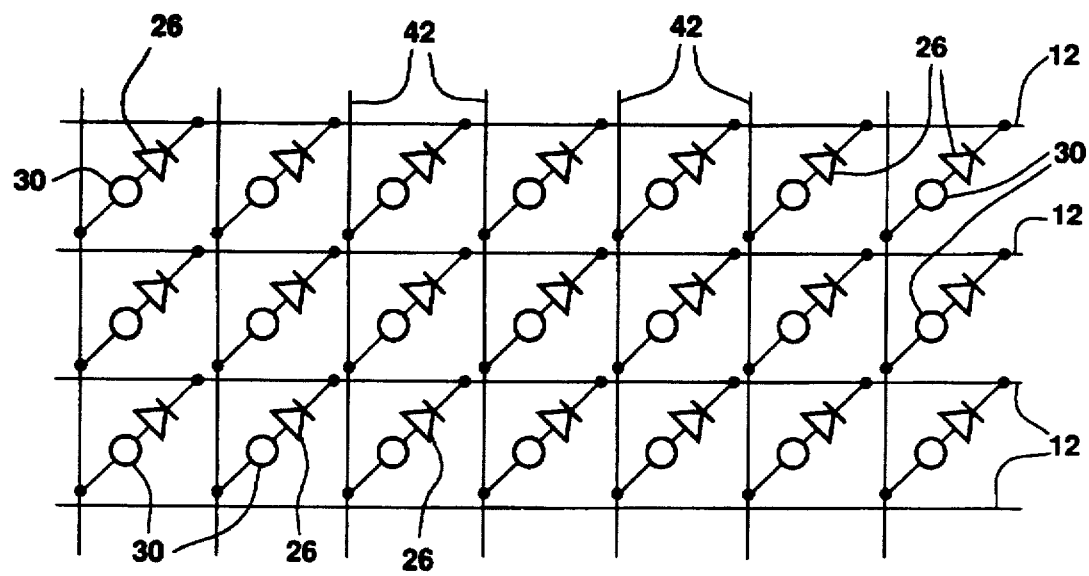
FIG. 4 is a schematic diagram of the memory elements from FIG. 1 showing, in addition, how isolation elements such as diodes are connected in series with the memory elements to electrically isolate each of the devices from the others.

Each memory element is electrically isolated from the others by using some type of isolation element. FIG. 4, a schematic diagram of the memory device layout, shows how electrical isolation can be accomplished using diodes. The circuit comprises an X-Y grid with the memory elements 30 being electrically interconnected in series with isolation diodes 26. Address lines 12 and 42 are connected to external addressing circuitry in a manner well known to those skilled in the art. The purpose of the isolation elements is to enable each discrete memory elements to be read and written without interfering with information stored in adjacent or remote memory elements of the matrix.

Figure 5:
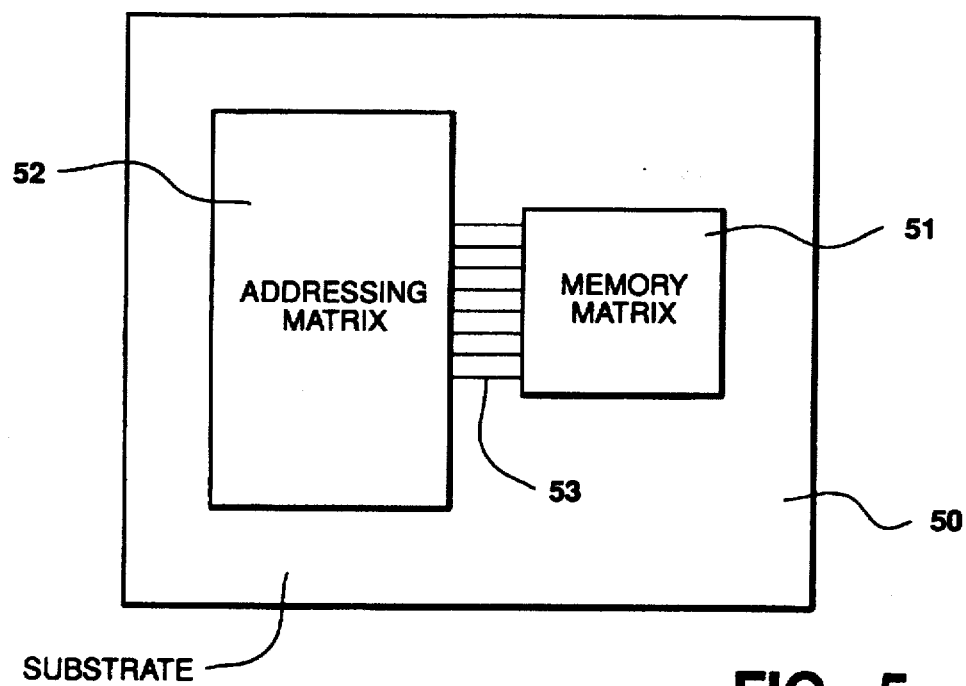
FIG. 5 is a schematic representation illustrating a single crystal semiconductor substrate with the integrated memory matrix of the instant invention as depicted in FIG. 1 placed in electrical communication with an integrated circuit chip on which the address/drivers/decoders are operatively affixed.

FIG. 5 shows a portion of a single crystal semiconductor substrate 50 with a memory matrix 51 of the present invention formed thereon. Also formed on the same substrate 50 is an addressing matrix 52 which is suitably connected by integrated circuitry connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

In prior art semiconductor memories having the relatively high switching speeds and low switching energies deemed necessary for most applications thereof, at least one transistor and charge storage elements is required for each memory element. The formation of such memories in integrated circuit form requires at least three connections along with other additional complexities which occupy a certain minimum substrate area regardless of how the integrated circuit is laid out. The integrated circuit configuration of the electrically erasable memory of the present invention requires only two connections to each memory element and these can be made in vertical relationship to each other. Further, each memory element, complete with isolating diode and the pair of contacts for the element, is itself fully vertically integrated such that a significantly higher bit density is possible. In fact, the memory of the present invention provides for a bit density which is greater than that attainable even in solid state dynamic random access memories (DRAMs), which are volatile and therefore lack the further advantages that the non-volatility attainable with the present invention provides. The increase in bit density attainable with the present invention translates into a corresponding reduction in manufacturing costs because of the smaller areas of the wafer occupied per bit of the integrated circuit configuration. This allows the memory of the present invention to compete with and surpass other available memories for a wider range of applications, not only in terms of electrical performance and memory storage capacity, but also in terms of cost. By comparison with prior art semiconductor memories formed of at least one transistor and a capacitor for each bit, the integrated circuit configurations of the present invention, as shown in FIG. 1, can be formed on a chip with greater bit density compared to prior art configurations using the same photo lithographic resolution. In addition to the cost advantages that the higher bit density affords, the elements are positioned closer together and lead lengths, capacitances, and other related parameters are further minimized, thereby enhancing performance.

Experimentation has shown that factors such as pore dimensions (diameter, thickness and volume), chalcogenide composition, thermal preparation (post deposition anneal), signal pulse duration, impurities such as oxygen present in the composition, crystallite size and signal pulse waveform shape have an effect on the magnitude of the dynamic range of resistances, the absolute end-point resistances of said dynamic range, and the voltages required to set the device at these resistances. For example, relatively thick chalcogenide films (i.e. about 4000 Å) will result in higher set voltage requirements (and therefore higher current densities within the volume of memory material), while relatively thin chalcogenide layers (i.e. about 250 Å) will result in lower set voltage (and current density) requirements. Of course, the possible significance of crystallite size and, therefore, the ratio of the number of surface atoms relative to the number of bulk atoms has previously been described.

The signal pulse duration required to set the memory element to the desired resistance level within the dynamic range of electrical resistances will likewise be dependent upon all of the foregoing factors as well as signal current level. Typically signal pulse durations will be less than about 250 nanoseconds and preferably less than about 50 nanoseconds. It is to be stressed that even the short 25 nanosecond pulse widths noted are dependent on the size and shape of the pore as well as the thickness and composition of the semiconductor alloy employed. It is believed that the pulse durations can be significantly reduced without interfering with the operation of the memory switch. Experimentation suggests that the input of lesser amounts of energy will increase the cycle life of the elements.

A feedback loop which reads and, when required, adjusts the resistance of a given memory element may be incorporated into the memory systems of the instant invention. For example, a memory element may initially be set at a desired resistance; however, in time the resistance of the element may drift slightly from the value at which it was originally set. The feedback loop, in this instance, would calculate and deliver a refresh signal pulse of the required voltage and duration to the memory element to bring it back to a preselected resistance value. Also, circumstances may exist where the set pulse delivered to a memory element may not result in setting of the element at the desired resistance value. In this case the feedback loop would deliver additional signal pulses to the element until the desired resistance level is achieved. The total duration of this series of set/adjust cycles is less than about 1,000 nanoseconds and preferably less than about 500 nanoseconds.

The ability to reversibly move up and down the linear portion of the resistance versus device current curve cannot be overemphasized. A pulse of a selected current can set the memory element to a desired resistance, regardless of the previous set condition thereof. This ability to reversibly move along the curve provides for direct overwrite of previously stored data. Such direct overwrite capability is not possible with the phase change and MSM (a-Si) memory materials of the prior art. This ability to reversibly set intermediate resistance values is remarkable. A thousand successive medium current pulses achieves the same resistance value as a higher current pulse followed by a single medium current pulse or a lower current pulse followed by a single medium current pulse.

The dynamic range of resistances also allows for broad gray scale and multilevel analog memory storage. Multilevel memory storage is accomplished by dividing the broad dynamic range into a plurality of sub-ranges or levels. The continuous resistance programmability allows for multiple bits of binary information to be stored in a single memory cell. This multilevel storage is accomplished by mimicking multiple bits of binary information in pseudo-analog form and storing this analog information in a single memory cell. Thus, by dividing the dynamic range of resistances into $2^n$ analog levels, each memory cell would be provided with the capability of storing n bits of binary information.

As indicated hereinabove, FIG. 6 is a ternary diagram of the Ge—Te—Sb semiconductor alloy system. In addition to the information previously discussed of which the binary and ternary phases are indicated by squares (■), this diagram gives information on the segregation of other alloys. These other alloys are indicated by triangles (▲), diamonds (♦) and circles (●) and phases into which the alloys can segregate, upon rapid solidification from the melt, are indicated by the lines (solid or dashed) which extend therefrom. The starting compositions of two Te-rich melts are indicated by circular symbols on the ternary diagram. Upon rapid solidification, these mixtures phase segregate into elemental Te plus phases B, C and D.

Melts with compositions to the right of the pseudobinary line, indicated by diamond symbols, solidify into the phases indicated by the lines on the diagram. Other mixtures, indicated by triangles in the phase diagram, solidify into elemental Ge and Sb and into phase A. An alloy of particular interest for use in the improved memory elements of the present invention is $Ge_{22}Sb_{22}Te_{56}$, also referred to as $Ge_2Sb_2Te_5$ or 2-2-5. This 2-2-5 alloy, upon rapid solidification, phase segregates into a mixture of two distinct phases of compositions B ($Ge_{26}Sb_{18}Te_{56}$) and C ($Ge_{18}Sb_{26}Te_{56}$) indicated in the phase diagram of FIG. 6. Another alloy of particular interest is $Ge_{14}Sb_{29}Te_{57}$ (also referred to as $GeSb_2Te_4$ or 1-2-4) which is composition D on the GeTe—$Sb_2Te_3$ pseudobinary line. The 2-2-5 and 1-2-4 alloys are of interest for forming the volume of memory material in compositionally graded, layered or combine graded\layered form, as discussed hereinabove.

There is a threshold switching voltage associated with the programming of the Ovonic EEPROM and, therefore, one expects that, like threshold switches, the Ovonic EEPROM programming voltage will show a chalcogenide alloy film thickness dependence. In fact, in the Ovonic EEPROM, a threshold switching voltage serves to separate read events from programming events, eliminating read upset and providing good operational margin during data reading. Our devices show linear resistance characteristics when the applied field is low, followed by a gradual decrease in resistance with increasing field, up to a threshold voltage. Once the threshold voltage is exceeded, the device exhibits a negative resistance transition to a highly conductive, "dynamic on" state. When the applied field is removed, the device returns to a non-volatile programmed resistance state, the value of which depends on the current/energy profile the device has experienced during its "memory equilibration time" while in the dynamic on state. Although the threshold voltage depends on the resistance of the device, the device current at the threshold voltage is relatively constant for all device resistances. A linear approximation to the thickness, threshold voltage relationship shows a proportionality factor of less than one, which contributes to a wide operating margin in devices having the same nominal thickness.

Through the use of the proprietary materials and device configurations disclosed herein, an electrically erasable, directly overwritable memory element has been developed which provides fast read and write speeds, approaching those of SRAM devices; non-volatility and random access reprogramming capabilities of an EEPROM; and a price per megabyte of storage significantly below any other semiconductor memory.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. In an electrically operated, directly overwritable, multibit, single-cell memory element including:
   a volume of memory material defining a single cell memory element including at least one chalcogen element and at least one transition metal element and said memory material characterized by (1) a large dynamic range of electrical resistance values, and (2) the ability for at least a filamentary portion of said memory material to be set to one of a plurality of resistance values within said dynamic range in response to selected electrical input signals so as to provide said single-cell memory element with multibit storage capabilities;
   at least a filamentary portion of said single cell memory element being setable, by said selected electrical signal to any resistance value in said dynamic range, regardless of the previous resistance value of said material;
   first and second spacedly disposed contacts for supplying said electrical input signal to set said memory material to a selected resistance value within said dynamic range;
   the improvement comprising, in combination:
   said second contact tapering to a peak adjacent said memory material.

2. The memory element of claim 1, wherein said chalcogen element is selected from the group of Te, Se, Ge, Sb and mixtures thereof.

3. The memory element of claim 1, wherein said first contact includes an adjacent thin-film layer adjacent said memory material.

4. The memory element of claim 3, wherein said adjacent thin-film layer is comprised of carbon material.

5. The memory element of claim 3, wherein said adjacent thin-film layer includes Ti, and two or more elements selected from the group consisting of C, N, Al, Si and mixtures or alloys thereof.

6. The memory element of claim 3, wherein the thickness of said adjacent thin-film layer is about 100 Å to 2000 Å.

7. The memory element of claim 1, wherein said first contact further includes a remote thin-film layer spacedly disposed from said memory material.

8. The memory element of claim 7, wherein said remote thin-film layer is comprised of one or more elements selected from the group consisting of Ti, W, Mo and mixtures or alloys thereof.

9. The memory element of claim 7, wherein the thickness of said remote thin-film contact layer is about 100 Å to 4000 Å.

10. The memory element of claim 1, wherein the cross-sectional diameter of the peak of said second contact is less than 2000 Å.

11. The memory element of claim 1, wherein the cross-sectional diameter of said peak is less than 1000 Å.

12. The memory element of claim 1, wherein the cross-sectional diameter of said peak is less than 500 Å.

13. The memory element of claim 1, wherein said second spacedly disposed contact is conically pointed.

14. The memory element of claim 1, wherein said second spacedly disposed contact is pyramidally pointed.

15. The memory element of claim 1, wherein said second spacedly disposed contact further comprises a first thin-film layer.

16. The memory element of claim 15, wherein said first thin-film layer includes Ti, and two or more elements selected from the group consisting of C, N, Al, Si and mixtures or alloys thereof.

17. The memory element of claim 15, wherein said second spacedly disposed contact further comprises a second thin-film layer comprised of one or more elements selected from the group consisting of Ti, W, Mo and mixtures or alloys thereof.

* * * * *